United States Patent [19]

Kelleher et al.

[11] Patent Number: 4,599,564
[45] Date of Patent: Jul. 8, 1986

[54] TUBULAR SEMICONDUCTOR MAGNETIC FIELD SENSOR AND CIRCUITS FOR USE THEREWITH

[75] Inventors: Kevin C. Kelleher, Washington Township, Daviess County; Larry M. Hughes, Indianapolis, both of Ind.

[73] Assignee: RCA Corporation, Princeton, N.J.

[21] Appl. No.: 549,563

[22] Filed: Nov. 7, 1983

[51] Int. Cl.⁴ .................. G01R 33/06; H03K 17/90
[52] U.S. Cl. ............................ 324/251; 307/309; 338/32 H
[58] Field of Search ............. 324/251, 252; 338/32 H; 307/309

[56] References Cited

U.S. PATENT DOCUMENTS

| | | | |
|---|---|---|---|
| 3,028,092 | 4/1963 | Fay | 338/32 H |
| 3,194,990 | 7/1965 | Kendall . | |
| 3,266,003 | 8/1966 | Nieda | 338/32 H |
| 3,304,530 | 2/1967 | Honig . | |

FOREIGN PATENT DOCUMENTS 2143040A 1/1985 United Kingdom .
2151790A 7/1985 United Kingdom .

Primary Examiner—Ernest F. Karlsen
Assistant Examiner—Walter E. Snow
Attorney, Agent, or Firm—Joseph S. Tripoli; Robert L. Troike; William H. Meise

[57] ABSTRACT

A structure employing the Hall effect for indicating the direction of a magnetic field and comprising a two-ended tubular device of a semi-conductive material and a current generating means for creating, in the absence of a magnetic field, a circumferentially uniformly distributed current flowing between the two ends of the tubular device. A plurality of conductive, wire-like elements extend radially through the tubular device toward the axis thereof and in a common plane normal to such axis and with adjacent ones of the wire-like elements being spaced apart equal angular distances. Calculating logic responds to the relative voltages induced in the wire-like elements when the tubular device is placed in a magnetic field to determine the direction of the magnetic field.

4 Claims, 7 Drawing Figures

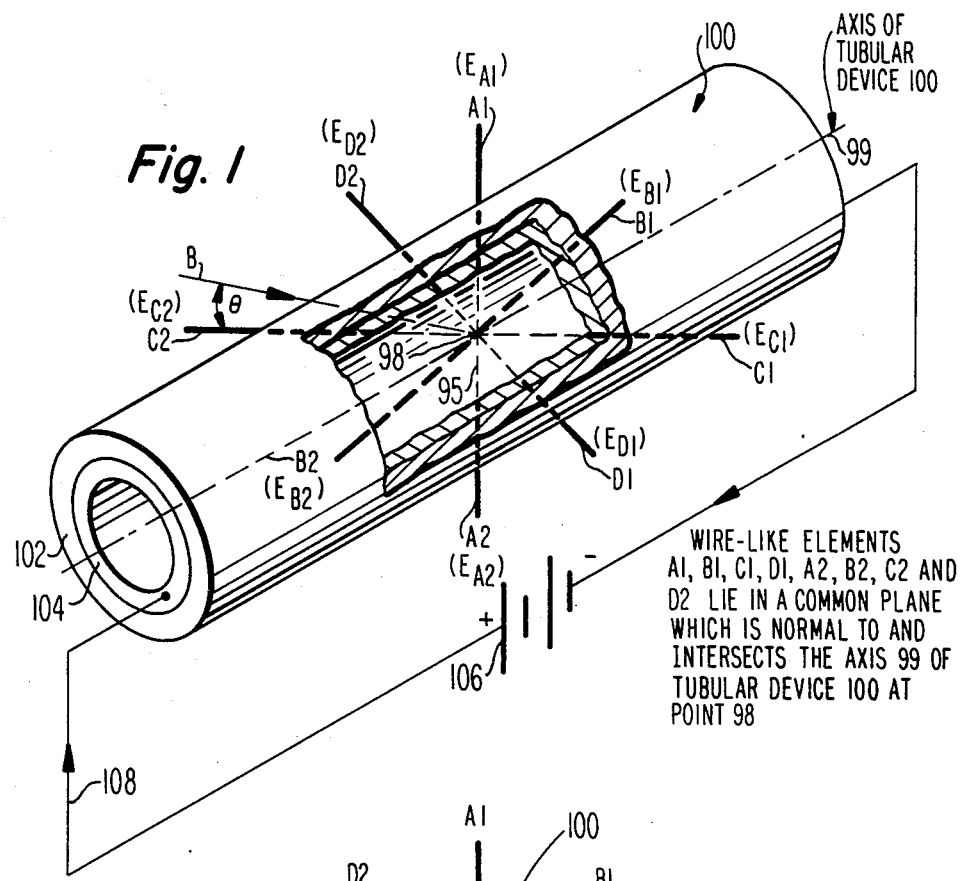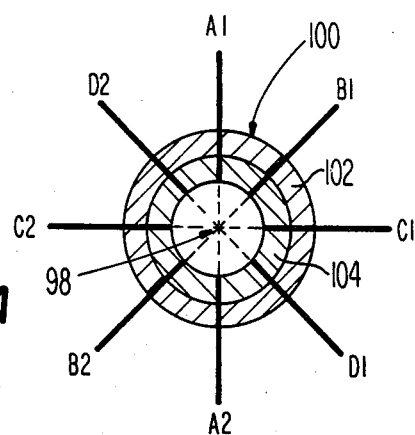

$$E_R = \sqrt{|E_A|^2 + |E_C|^2}$$

$\left.\begin{array}{l} A2 = 1 \\ P_A = - \\ P_C = - \end{array}\right\}$ EXAMPLE DEPICTED IN VECTOR DIAGRAM ∴ MEASURED FROM A1 THE MAGNETIC FIELD DIRECTION IS $90° + \theta$ WITH A MAGNITUDE $E_R = \sqrt{|E_A^2| + |E_C^2|}$

| ROW | PAIR OF CONDUCTORS HAVING LARGEST SIGNAL DIFFERENCE | POLARITY $P_A$ | $P_C$ | $P_B$ | $P_D$ | DECODER AND ADDER FUNCTION $(N\pi/16 \pm \theta)$ |
|---|---|---|---|---|---|---|
| 1 | C=1 | − | + | × | × | 0° + $\theta$ |
| 2 | D=1 | × | × | + | + | 22.5° + $\theta$ |
| 3 | D=1 | × | × | − | + | 45° + $\theta$ |
| 4 | A=1 | − | + | × | × | 67.5° + $\theta$ |
| 5 | A=1 | − | − | × | × | 90° + $\theta$ |
| 6 | B=1 | × | × | − | + | 112.5° + $\theta$ |
| 7 | B=1 | × | × | − | − | 135° + $\theta$ |
| 8 | C=1 | − | − | × | × | 157.5° + $\theta$ |
| 9 | C=1 | + | − | × | × | 180° + $\theta$ |
| 10 | D=1 | × | × | − | − | 202.5° + $\theta$ |
| 11 | D=1 | × | × | + | − | 225° + $\theta$ |
| 12 | A=1 | + | − | × | × | 247.5° + $\theta$ |
| 13 | A=1 | + | + | × | × | 270° + $\theta$ |
| 14 | B=1 | × | × | + | − | 292.5° + $\theta$ |
| 15 | B=1 | × | × | + | + | 315° + $\theta$ |
| 16 | C=1 | + | + | × | × | 337.5° + $\theta$ |
| | COLUMN I | COLUMN II | | | | COLUMN III |

*Fig. 5*

TUBULAR SEMICONDUCTOR MAGNETIC FIELD SENSOR AND CIRCUITS FOR USE THEREWITH

This invention relates to Hall effect devices and more particularly to an improved Hall effect device which can be employed to detect the direction and magnitude of a magnetic field.

The Hall effect is the generation of a voltage resulting from a current flow through a conductor at right angles to an ambient magnetic field. The voltage (gradient) generated is perpendicular to both the magnetic field and the current flow. This phenomenom has found practical application as a relatively sensitive magnetic field detector with a semi-conductive material frequently being employed as the conductor because of the substantial Hall effect voltages generated in semi-conductors.

Conventionally, such semi-conductive materials are formed as a rectangular thin film across which the Hall effect voltage is measured. Obviously, to measure the strength of a given magnetic field the rectangular thin film must be positioned properly with respect to the direction of the magnetic field. If used to detect magnetic fields having an unknown direction, it is necessary to use a number of such thin semi-conductive films and then to calculate from the voltages generated across each of the thin films the direction and magnitude of the magnetic field.

It is a primary function of the present invention to provide a Hall effect device which will detect the direction and strength of a magnetic field in any direction in a given plane.

In accordance with a preferred form of the invention there is provided a tubular device comprised of a semi-conductive material with a plurality of conductive wire-like elements spaced apart circumferentially around the tubular device (i.e., radially) and with each wire extending from the outside of the tubular device into the center thereof. A current is caused to flow from one end of the tubular device to the other end thereof with the flow being uniformly distributed around the circumference of the tubular device. Also provided are means for detecting the amount of electric charge-created voltage produced on each of the wire-like elements when the tubular device is placed in a magnetic field having a component thereof which is perpendicular to the axis of the tubular device.

In the drawings:

FIG. 1 is an isometric view of the tubular element with a portion thereof cut away to show the positioning of the voltage-collecting wire-like elements therein;

FIG. 1A shows the end of the tubular element cut away in the plane of the wire-like elements;

FIG. 5 is a chart showing the angular relation between an ambient magnetic field and the voltages generated on the various wire-like elements of the tubular device of FIG. 1.

Figure 2:
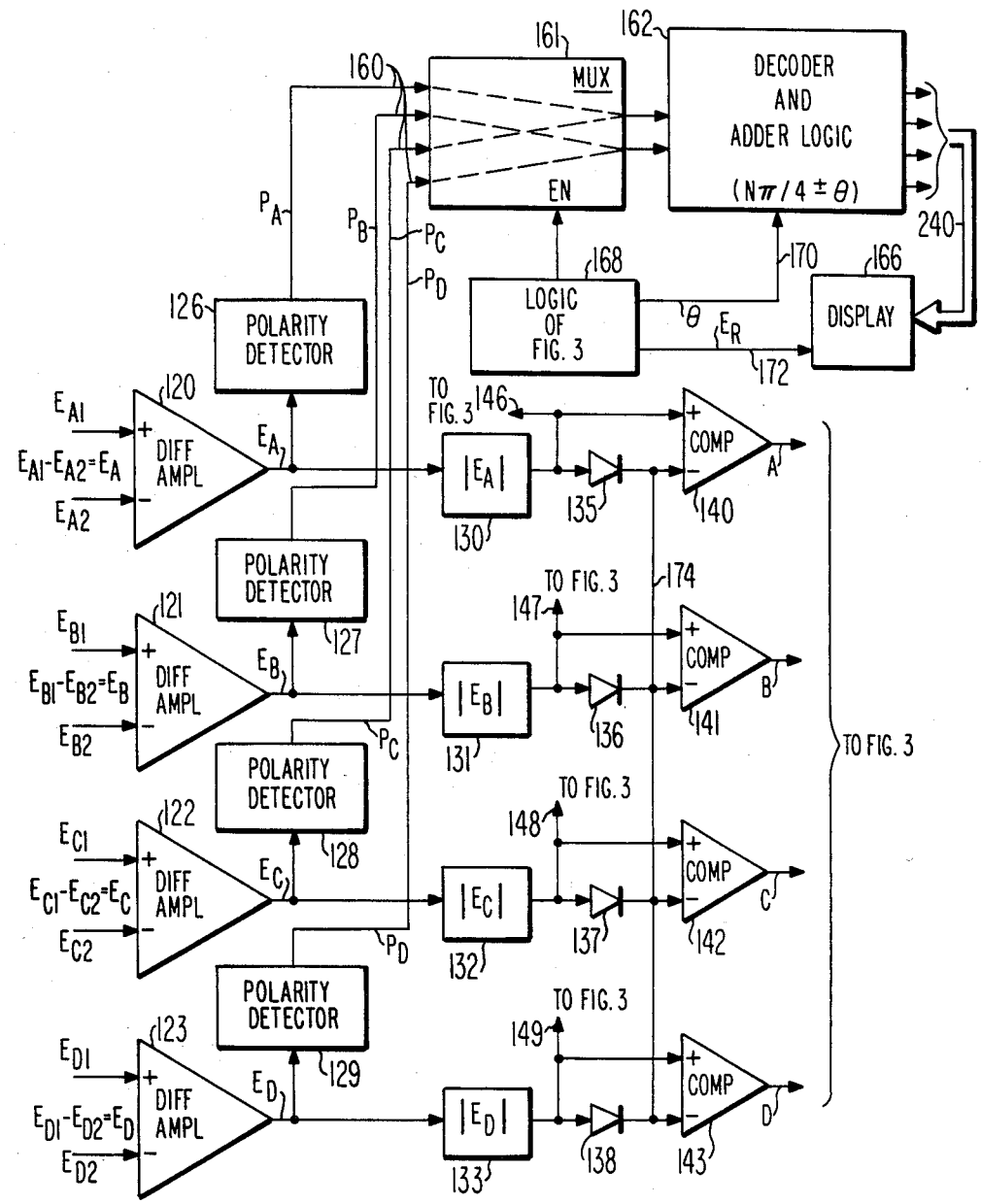
FIG. 2 is a combination block and logic diagram of a structure for determining which of the wire-like elements has the greatest potential thereon and its polarity.

Referring now to FIGS. 1 and 1A, tubular device 100 can have an insulative and supporting outer tubular shell 102 of ceramic material and a concentric inner tubular element 104 of a semi-conductive material with a common axis 99. Eight conductive wire-like elements are positioned circumferentially (i.e., radially) around the tubular device 100 in a common plane perpendicular to the axis 99 and extend radially through the ceramic outer casing 102 and to the inner surface of the semi-conductive tubular element 104, but do not connect to each other within the tubular element 104. The radial dotted lines such as dotted line 95 simply indicate the radial alignment of the wire-like elements. These wire-like elements are arranged in four oppositely positioned pairs of wire-like elements identified as pairs of wire-like elements A1-A2, B1-B2, C1-C2, and D1-D2 and shown in another perspective in FIG. 1A. A voltage source is connected across the end of the semi-conductive tubular element 104, the ends of which can be coated with a conductive material so that the current flowing through the semi-conductive element 104 from end to end thereof, in the absence of an ambient magnetic field, is uniformly distributed circumferentially around the semi-conductive tubular element 104.

When a magnetic field, such as magnetic field B (FIG. 1), is present the current flowing in semi-conductive element 104 is caused to migrate in a direction perpendicular to the magnetic field B. It can be seen, in the example being discussed, that the largest migration of electrons will be towards the wire-like element A2, and the greatest migration of electrons will be away from the wire-like element A1. Thus, the pair of wire-like elements A1 and A2 will have the greatest difference of potential thereacross, with A1 being more positive than A2.

The smallest difference of potential generated in the pairs of wire-like elements due to magnetic field B will be across wire-like elements C1 and C2. This is because the alignment of wire-like elements C1 and C2 is most nearly parallel with the magnetic field B and therefore the migration of electrons in wire-like elements C1 and C2 is smaller than in any other pair of wire-like elements. Thus, the voltage developed across C1 and C2 is smaller than across any other pair of wire-like elements.

It can be shown that the difference of potential between wire-like elements C1 and C2 is a function of sin $\theta$ and the voltage difference between wire-like elements A1 and A2 is a function of cos $\theta$, where $\theta$ is the angle between the line of wire-like elements C1 and C2 and the direction of the magnetic field B. It can thus be seen that if the voltages across elements C1 and C2 and elements A1 and A2 are known, then by simple trigonometric calculations the angle $\theta$ can be determined, as well as the voltage which is proportional to the magnitude of the magnetic field B. The foregoing calculations will be discussed in more detail later herein in connection with the vector type diagram of FIG. 4.

It can be seen from the above that to determine the direction and magnitude of the ambient magnetic field B, it is necessary to determine which pair of wire-like elements of FIG. 1 has the greatest potential thereacross. It follows that the pair of wire-like elements disposed at 90° with the pair of wire-like elements having the greatest potential thereacross will have the least voltage thereacross for the reasons discussed above. Thus, if the pair of wire-like elements A1 and A2 have the greatest potential thereacross, the pair of wire-like elements C1 and C2 will have the least.

The logic of FIG. 2 determines which pair of wire-like elements has the largest voltage thereacross. In FIG. 2, the voltages generated by each pair of wire-like elements is supplied to the two inputs of the four differential amplifiers 120, 121, 122, and 123. For example, the voltages $E_{A1}$ and $E_{A2}$, generated by the wire-like elements A1 and A2, are supplied to the two inputs of differential amplifier 120. The voltages $E_{B1}$ and $E_{B2}$ generated on wire-like elements B1 and B2 are supplied to the inputs of differential amplifier 121; the voltages $E_{C1}$ and $E_{C2}$ generated by wire-like elements C1 and C2, are supplied to the inputs of differential amplifier 122; and the voltages $E_{D1}$ and $E_{D2}$, generated by the wire-like elements D1 and D2, are supplied to the inputs of differential amplifier 123.

The outputs of each of the four differential amplifiers 120-123 will be the algebraic difference between the values of two applied voltages. More specifically, consider the two input voltages $E_{A1}$ and $E_{A2}$ supplied to differential amplifier 120. The differential amplifier 120 will subtract $E_{A2}$ from $E_{A1}$ to produce an output voltage $E_A$ which can be either plus or minus depending on the polarities of the two input voltages. A polarity detector 126 will determine the polarity of $E_A$ and supply an indication of such polarity through multiplexer (MUX) 161 to decoder and adder logic 162 for purposes which will be discussed later in connection with FIG. 3.

The output of differential amplifier 120 is also supplied to magnitude detector 130 which will determine the absolute value of $E_A$ and supply it through diode 135 to the negative input of comparator 140. The output $E_A$ of magnitude detector 130 is also supplied directly to the positive input of comparator 140. The circuit parameters are adjusted so that in the absence of any other voltages being supplied to the two inputs of comparator 140, the small voltage drop across diode 135 will always result in the voltage supplied to the positive input of comparator 140 being slightly larger (more positive) than that supplied to the negative input. Thus the output of comparator 140 will always be a high level signal, a condition which can be changed, however, by another signal appearing on the common lead 174, as will be discussed below.

In a similar manner, the outputs of differential amplifiers 121, 122, and 123 are supplied respectively to polarity detectors 127, 128, and 129, and to magnitude detectors 131, 132, and 133. The outputs of magnitude detectors 131, 132, and 133 in turn are supplied respectively through diodes 136, 137, and 138 to the negative inputs of comparators 141, 142, and 143, and directly to the positive inputs of comparators 141, 142, and 143.

Assume for purposes of discussion that the absolute magnitude of $E_A$, as determined by magnitude detector 130, is larger than the absolute magnitudes of the voltages $E_B$, $E_C$, or $E_D$, as determined by magnitude detectors 131, 132, and 133. The voltage on common bus 174 will then be equal to $E_A$ (less the small voltage drop across diode 135) and will cause the output signals appearing on output leads B, C, and D of comparators 141, 142, and 143 to all be low level signals since the positive inputs to each of comparators 141, 142, and 143 will be less than the input signal to the minus inputs thereof. However, the output A of comparator 140 will have a high level signal thereon.

Figure 3:
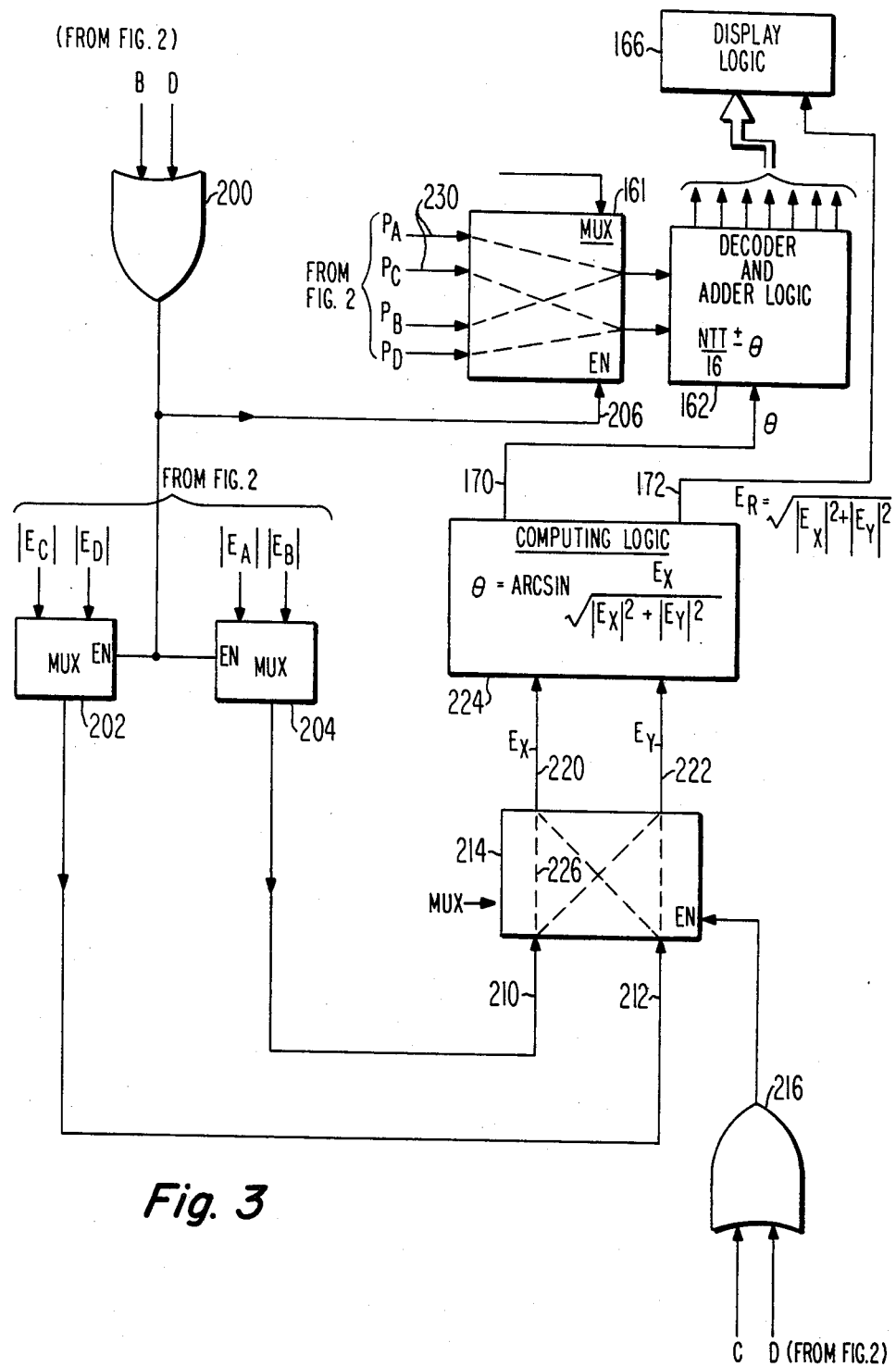
FIG. 3 is another combination block and logic diagram of a structure for calculating the direction and magnitude of that component of a magnetic field which is perpendicular to the axis of the tubular device based on the output signals produced by the logic of FIG. 2.

Thus, in FIG. 3 a low level output signal will be supplied from OR gate 200 since input signals on both of the input leads B and D, which are connected to the output terminals of comparators 141 and 143 of FIG. 2, will be low level signals. The two MUXes 202 and 204 will respond to such low level signal supplied to their enable inputs to conduct the voltages $E_A$ and $E_C$ (from outputs 146 and 148 of magnitude detectors 130 and 132 of FIG. 2) therethrough to the two inputs 210 and 212 of a third MUX 214.

In the example being considered it has been determined by the logic of FIG. 2 that the two voltage values $E_A$ and $E_C$ will be employed in the computation to determine the direction and magnitude of the magnetic field B. While, in this example, it is assumed that $E_A$ is greater than $E_C$, it can be seen that with another direction of the magnetic field $E_C$ could be greater than $E_A$. Depending upon whether $E_C$ or $E_A$ is the greater, the value of $E_X$ in the expression within computing logic 224 will be either $E_A$ or $E_C$ and $E_Y$ will be the other value of $E_A$ or $E_C$. Thus, if $E_A$ is greater than $E_C$, and since the two inputs C and D supplied to OR gate 216 both have low level signals thereon, MUX 214 will supply $E_A$ directly therethrough via route 226 to the input 220 of computing logic 224. The value $E_C$ will be supplied through MUX 214 to input 222 of computing logic 224.

On the other hand, if $E_C$ should be greater than $E_A$, the output of OR gate 216 will be a high level signal to cause MUX 214 to supply $E_A$ to input 222 of computing logic 224 and $E_C$ to input 220 of computing logic 224. Thus $E_C$ will then become $E_X$ and $E_A$ will become $E_Y$ in the expression contained in computing logic 224.

It is apparent that if either of outputs B or D of comparators 141 and 143 has the largest output signal thereon, as determined by the logic of FIG. 2, then MUX 214 is controlled by the signal on the D input to OR gate 216 to direct $E_B$ either to input 220 or 222, depending upon whether the signal on input D is greater or less than that on input B. Also, if either of the inputs B or D has a high level signal thereon the output of OR gate 200 will be a high level signal to enable MUXes 202 and 204 to cause the values $E_B$ and $E_D$ to pass therethrough to inputs 210 and 212 of MUX 214.

The computation of a voltage $E_R$, proportional to the magnitude of the magnetic field B, is performed in computer logic 224 and appears on output terminal 172 and has the following value:

$$E_R = \sqrt{|E_X|^2 + |E_Y|^2}$$

The computation of $\theta$ employs the same expression used to determine the magnitude of $E_R$ and is defined by the following expression:

$$\theta = \arcsin \frac{E_x}{\sqrt{|E_x|^2 + |E_y|^2}}$$

The value of $\theta$ appears on output terminal 170 of computing logic 224 and is supplied to one input of decoder and adder logic 162.

Once it has been decided which pair of wire-like elements is being used to calculate the value of $\theta$ and the magnitude of the magnetic field, the polarities of the values of the voltages generated by the selected pairs of wire-like elements are supplied through MUX 161 to decoder 162. More specifically, if the two pairs of wire-like elements being employed to compute $\theta$ are A1-A2 and C1-C2, then the polarity of the voltages generated across these two pairs of wire-like elements, as determined by the outputs of the four polarity detectors 126-129 of FIG. 2, are supplied to the two inputs 230 of MUX 162 (FIG. 3) and then through MUX 161 to decoder 162 as $P_A$ and $P_C$. The selection of the polarity indicating signals $P_A$ and $P_C$, is made to the exclusion of the selection of polarity indicating signals $P_B$ and $P_D$, by the operation of MUX 161. On the other hand, if either the B or the D inputs of OR gate 200 has a high level signal thereon, then MUX 161 will respond to the high level output of OR gate 200 to supply the polarity indicating signals $P_B$ and $P_D$ to decoder 162.

Figure 6:
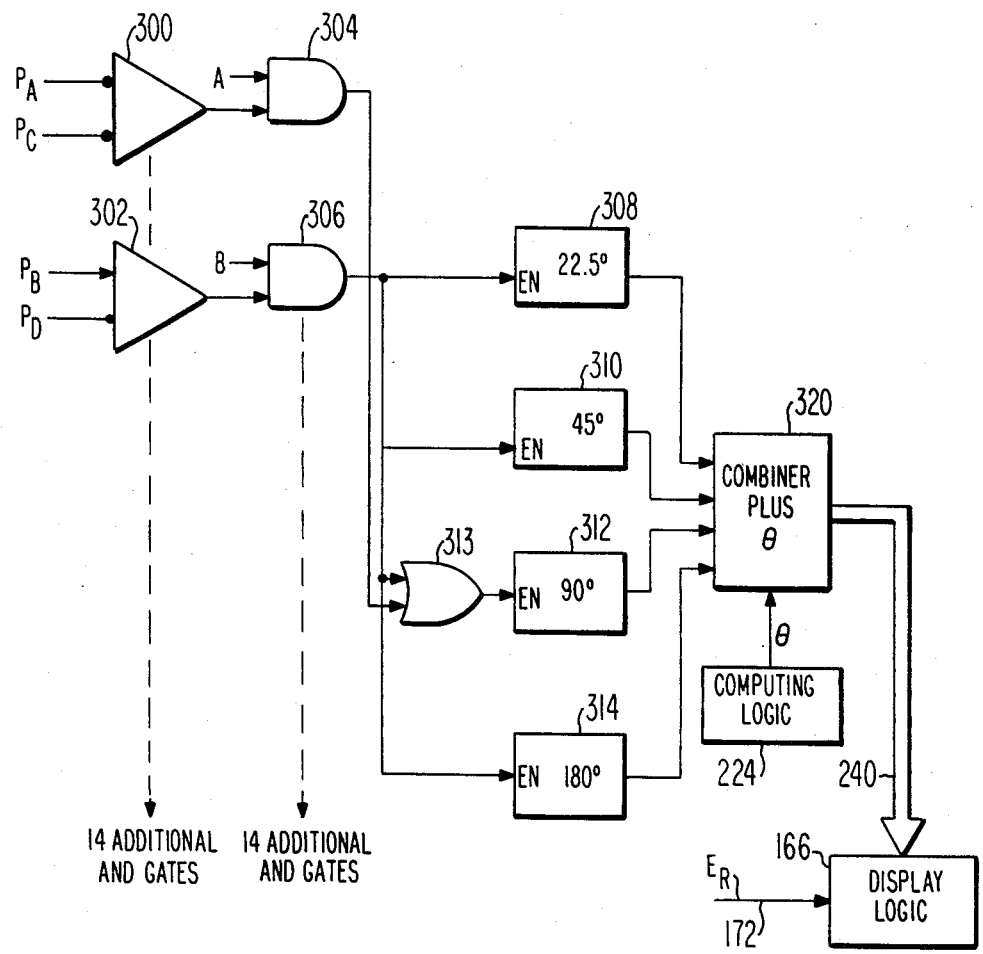
FIG. 6 is a more detailed combination block and logic diagram of the decoder and adder logic 162 of FIG. 3.

A representative portion of the logic within decoder and adder logic 162 is shown in detail in FIG. 6. A first level of sixteen AND gates, of which only AND gates 300 and 302 are shown in FIG. 6, receive the polarity indicating signals $P_A$ and $P_C$ or $P_B$ and $P_D$ in the various combinations shown in Column II of the chart of FIG. 5. A second level of sixteen AND gates such as AND gates 304 and 306, AND together the outputs of the first level of AND gates such as AND gates 300 and 302 with a selected one of the outputs A, B, C, and D of comparators 140-143 of FIG. 2, as indicated in Column I of the chart of FIG. 5.

A high level output from an AND gate, such as AND gate 304 or 306, of which there would only be one for any single determination of direction angle and magnitude of a magnetic field, is employed to enable various and appropriate combinations of phase-representing logic such as logic 308, 310, 312, and 314. For example, if the polarity of the output signals from the selected differential amplifiers 120-123 of FIG. 2 are both negative, then AND gate 300, which has two inhibit inputs, will output a high level signal to AND gate 304. If the output on the A output terminal of comparator 140 of FIG. 2 is also high, AND gate 304 will output a high level signal through OR gate 313 to enable the phase-representing logic 312 (via OR gate 313) which will respond thereto to supply a 90° indicating signal to combiner logic 320. Combiner logic 320 will interpret such signal to represent 90° and will add 90° to the value of θ computed in the computing logic 224 of FIG. 3.

The example just discussed is shown in horizontal row 5 of the chart of FIG. 5.

Consider a second example as shown in horizontal row 14 of the chart of FIG. 5, where the pair of wire-like elements B has the highest output signal, where $P_B$ is positive, and where $P_D$ is negative. This second example is implemented by AND gates 302 and 306 of FIG. 6. The output of AND gate 302 is a high level signal and, when ANDed with the high level signal B in AND gate 306, will produce another high level signal which in turn will directly enable phase adding logic 308, phase adding logic elements 308 and 314, and also phase adding logic 312 through OR gate 313. The outputs of phase adding logic 308, 312, and 314 will be combined together in combiner 320 to produce a phase indication of 292.5°. This phase indication of 292.5° is added to the computed value of θ to give the direction of the magnetic field.

As indicated above, the chart of FIG. 5 is a graphical representation of the complete AND gate array (only partially shown in FIG. 6) required to perform the complete decoding and adding operation. Since there are sixteen possible operations as shown in the chart of FIG. 5, a first array of sixteen AND gates, such as AND gates 300, 302, and a second array of sixteen AND gates, such as AND gates 304 and 306 are required.

Vertical Column II of FIG. 5 shows either the pair of polarity inputs $P_A$ and $P_C$ or the pair of polarity inputs $P_B$ and $P_D$, presented to the first level of AND gates such as AND gate 300 or 302. Vertical column I shows which of the outputs A, B, C, or D of FIG. 2 is ANDed together with the output of a first level AND gate such as AND gate 300 or 302 in a second level AND gate, such as AND gate 304 or 306. Column III shows the resultant phase angle in response to any combination of inputs to the first and second level of AND gates.

Returning again to the logic of FIG. 6, the output of combiner 320 appearing on bus 240 is supplied to a suitable display logic 166 along with the magnitude $E_R$ of the measured magnetic field via lead 172. Display logic 166 can be chosen to display the direction and strength of the magnetic field either digitally or by means of a CRT.

Figure 4:
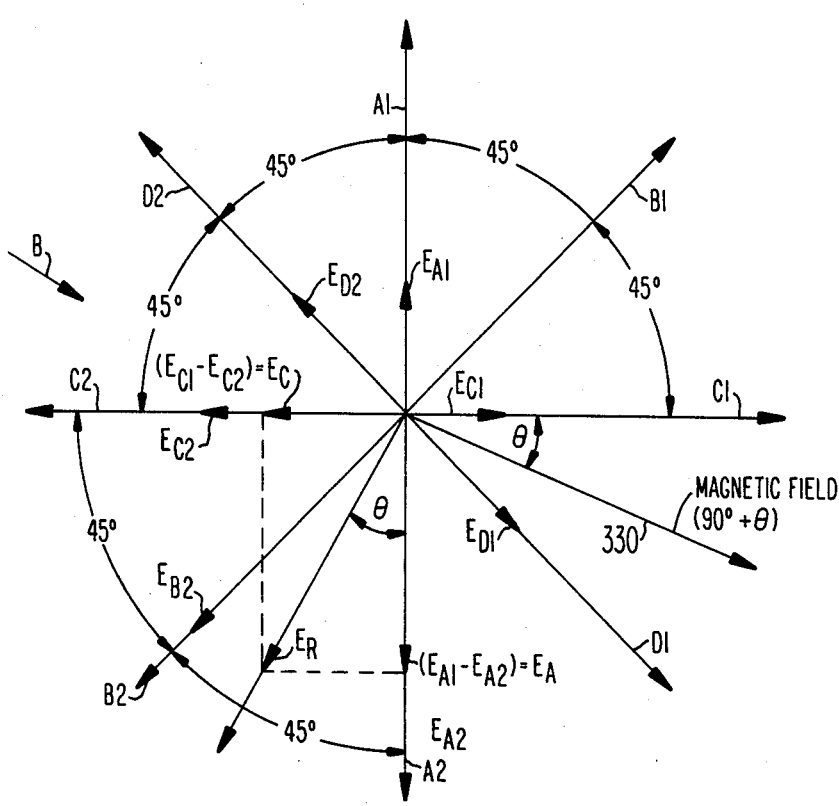
FIG. 4 is a vector diagram illustrating the basis for the calculations made by the logic of FIG. 3.

A specific example of the computation of a given magnetic field B is shown in the vector diagram of FIG. 4. In FIG. 4 the vectors A1, B1, C1, D1, A2, B2, C2, and D2, are spaced 45° apart and graphically represent the position and functional effect of the wire-like elements similarly labeled in FIG. 1. Voltages generated on these eight wire-like elements are represented as $E_{A1}$, $E_{B1}$, $E_{C1}$, $E_{D1}$, $E_{A2}$, $E_{B2}$, $E_{C2}$, and $E_{D2}$. In the example of FIG. 4, the pair of wire-like elements generating the largest voltage in response to the magnetic field B are wire-like elements A1 and A2. Specifically, the largest signal (the most positive) is generated in wire-like element A1, and the smallest (most negative) in wire-like element A2, so that the difference between the two voltages is the largest of any pair of the four pairs of wire-like elements. The computation of the strength and angle of a received magnetic field not only requires the largest voltage generated across a pair of wire-like elements but also the measurement of the voltage difference generated across the pair of wire-like elements C1 and C2 positioned 90° with respect to the wire-like elements A1 and A2.

Thus, in FIG. 4, the voltages $E_A$ and $E_C$ which are equal respectively to $(E_{A1}-E_{A2})$ and $(E_{C1}-E_{C2})$ are then employed to determine a resulting voltage $E_R$ which is equal to the square root of the sum of the squares of the voltages $E_A$ and $E_C$. It is known that in accordance with the Hall effect the voltage $E_R$ will be 90° removed from the direction of the magnetic field B. Thus the magnetic field B lies in the direction of the vector 330 of FIG. 4.

We claim:
1. An arrangement employing the Hall effect for indicating the direction of an ambient magnetic field and comprising:
   a monolithic device of a semi-conductive material, said device being in the form of a tube having at any position between the two ends of said tubular device a cross section defining a continuous semi-conductive path;
   current generating means for creating a longitudinal current between said two ends of said device, which longitudinal current, in the absence of a magnetic field, is circumferentially uniformly distributed;
   a plurality of conductive, wire-like elements, each being connected into said tubular device along a line extending radially through the body of said tubular device, each said line being directed towards the axis thereof and lying in a common plane normal to the axis of said tubular device and with adjacent ones of said wire like elements being spaced apart equal angular distances to divide the 360° angular distance around said tubular device into equal angular segments; and first means responsive to the relative voltages induced in said wire-like elements when said tubular device is placed in a magnetic field to indicate the direction of said magnetic field.

2. A structure as in claim 1, in which said wire-like elements are divided into oppositely positioned pairs of wire-like elements with respect to the axis of said tubular device, and in which said first means further comprises:

second means for determining a first pair of wire-like elements which has the greatest voltage difference therebetween and which wire-like element of said first pair is positive with respect to the other;

third means for determining a second voltage difference between a predetermined second pair of wire-like elements and which wire-like element of said second pair is positive with respect to the other; and calculating means responsive to said greatest voltage difference and to said second voltage difference to calculate the direction of said magnetic field.

3. An arrangement employing the Hall effect for indicating the direction of an ambient magnetic field, comprising:

a two-ended tubular device of a semi-conductive material;

current generating means for creating, in the absence of a magnetic field, a circumferentially uniformly distributed current between the two ends of said tubular device;

a plurality of conductive, wire-like elements, each being connected into said tubular device along a line extending radially through the body of said tubular device, each said line being directed towards the axis thereof and lying in a common plane normal to the axis of said tubular device, with adjacent ones of said wire-like elements being spaced apart equal angular distances to divide the 360° angular distance around said tubular device into equal angular segments, said wire-like elements being divided into oppositely positioned pairs relative to the axis of said tubular device;

first means responsive to the relative voltages induced in said wire-like elements when said tubular device is placed in a magnetic field to indicate the direction of the field, said first means comprising second means for determining a first pair of wire-like elements which has the greatest voltage difference therebetween and which wire-like element of said first pair is positive with respect to the other, third means for determining a second voltage difference between a predetermined second pair of wire-like elements spaced 90° on said tubular device from said first pair and which wire-like element of said second pair is positive with respect to the other; and calculating means responsive to said greatest voltage difference and to said second voltage difference to calculate the direction of said magnetic field, said calculating means comprising logic means for computing the relationships $$E_R = \sqrt{E_X^2 + E_Y^2}$$

and $$\theta = \arcsin \frac{E_X}{E_R}$$

where $E_X$ and $E_Y$ are the voltages generated across said first and second pairs of wire-like elements, respectively, where $E_R$ is a voltage proportional to the magnitude of the received magnetic field, and where $\theta$ is the angle of reception of said magnetic field in a given angular segment and the polarities of $E_X$ and $E_Y$ determine said given angular segment.

4. An arrangement employing the Hall effect for indicating the direction of an ambient magnetic field and comprising:

a two-ended tubular device of a semi-conductive material;

current generating means for creating, in the absence of a magnetic field, a circumferentially unformly distributed current between the two ends of said tubular device;

a plurality of conductive, wire-like elements, each being connected into said tubular device along a line extending radially through the body of said tubular device, each said line being directed towards the axis thereof and lying in a common plane normal to the axis of said tubular device and with adjacent ones of said wire-like elements spaced apart by equal angular distances to divide the 360° angular distance around said tubular device into equal angular segments, said wire-like elements being divided into pairs of wire-like elements oppositely positioned with respect to, and circumferentially positioned around and extending radially from, the axis of said tubular device;

first means responsive to the relative voltages induced in said wire-like elements when said tubular device is placed in a magnetic field to indicate the direction of said magnetic field, said first means comprising second means for determining a first pair of wire-like elements which has the greatest voltage difference therebetween and which wire-like elements of said first pair of positively poled with respect to the other, third means for determining a second voltage difference between a predetermined second pair of wire-like elements entering said tubular device at a circumferential position normal with respect to the circumferential position of said first pair of wire-like elements, and calculating means responsive to said greatest voltage difference and to said second voltage difference to calculate the direction of said magnetic field, said calculating means comprising logic means for computing the relationships.

$$E_R = \sqrt{E_X^2 + E_Y^2}$$

and $$\theta = \arcsin \frac{E_X}{E_R}$$

where $E_X$ and $E_Y$ are the voltages generated across said first and second pairs of wire-like elements, where $E_R$ is a voltage proportional to the magnitude of the received magnetic field, and where $\theta$ is the angle of reception of said magnetic field in a given 90° quadrant and the polarities of $E_X$ and $E_Y$ determine said given quadrant.

* * * * *